United States Patent [19]

Sung

[11] Patent Number: 5,573,963

[45] Date of Patent: Nov. 12, 1996

[54] METHOD OF FORMING SELF-ALIGNED TWIN TUB CMOS DEVICES

[75] Inventor: Jan M. Sung, Yang-Mei, Taiwan

[73] Assignee: Vanguard International Semiconductor Corporation, Hsin-Chu, Taiwan

[21] Appl. No.: 642,320

[22] Filed: May 3, 1995

[51] Int. Cl.$^6$ .................................................. H01L 21/8238
[52] U.S. Cl. .............................. 437/34; 437/57; 437/931; 148/DIG. 106
[58] Field of Search .................................. 437/34, 56, 57, 437/58, 41 RCM, 28, 29, 931, 164; 148/DIG. 106

[56] References Cited

U.S. PATENT DOCUMENTS

| 4,435,895 | 3/1984 | Parrillo et al. | 437/56 |
| 4,525,920 | 7/1985 | Jacobs et al. | 437/34 |
| 4,707,455 | 11/1987 | Tsang et al. | 437/57 |
| 4,732,869 | 3/1988 | Van Attekum et al. | 437/36 |
| 4,806,501 | 2/1989 | Baldi et al. | 437/56 |
| 5,019,520 | 5/1991 | Komori et al. | 437/34 |
| 5,160,996 | 11/1992 | Odanaka | 257/375 |
| 5,393,677 | 2/1995 | Lien et al. | 437/34 |
| 5,399,505 | 3/1995 | Dasse et al. | 437/8 |
| 5,399,518 | 3/1995 | Sim et al. | 437/52 |
| 5,403,767 | 4/1995 | Kim | 437/52 |
| 5,443,993 | 8/1995 | Park et al. | 437/60 |
| 5,460,984 | 10/1995 | Yoshida | 437/28 |
| 5,501,993 | 3/1996 | Borland | 437/34 |
| 5,525,532 | 6/1996 | Kim | 437/34 |

*Primary Examiner*—Michael Trinh
*Attorney, Agent, or Firm*—George O. Saile; William J. Stoffel

[57] ABSTRACT

The present invention provides a method of manufacturing twin wells in a silicon substrate which uses only one photo step and provides a smooth surface topology. The first embodiment begins by forming spaced field oxide regions in the substrate. The spaced field oxide regions define a first region and a second region. A masking layer composed of borophosphosilicate glass (BPSG) and a barrier layer are formed over the field oxide regions. The barrier layer and the masking layer over the first region are removed by a photo etch process. Then, N-type impurities are implanted into the first region forming a n-well using the barrier layer and masking layers as a mask. Then, p-type impurities are implanted into the substrate to form a p-type layer beneath the N-well and a P-well in the second region. The barrier layer and the masking layer are then removed. The substrate is then annealed to drive in the ion implanted impurities thereby forming a n-well and a p-well. A first embodiment uses a barrier layer formed of silicon nitride and a second embodiment uses a barrier layer formed of amorphous silicon.

23 Claims, 4 Drawing Sheets

METHOD OF FORMING SELF-ALIGNED TWIN TUB CMOS DEVICES

BACKGROUND OF INVENTION

1) Field of the Invention

This invention relates generally to the fabrication of semiconductor devices and more particularly to a method of fabricating twin tubs or wells in a silicon substrate.

2) Description of the Prior Art

In the fabrication of CMOS devices it is frequently desirable to make a complementary or symmetric environment with respect to the NMOS and PMOS devices. In other words, it is frequently necessary to create a suitable N-type region for the PMOS devices and a suitable P-type region for the adjacent NMOS devices. Each of these N-type and P-type regions is generally referred to as a "tub" or "well."

It is known that the formation of such N-wells and P-wells may be achieved by the implantation of an appropriate dopant species, such as boron or phosphorus, into a suitable substrate followed by the high temperature drive-in of the implanted ion. To manufacture advanced twin tub CMOS devices on almost intrinsic substrates with the known methods, starting from lightly doped at the limit intrinsic substrates, two tubs are formed with opposite conductivity type (P and N) in which N and P-channel transistors are respectively formed. In order to reduce latch-up problems (that is, switching on of parasite SCR structures) and to obtain more compact circuits, the two doping tubs are separated by a field oxide.

A typical process sequence uses a LOCOS-based approach to isolate like devices. The process is a two-mask, self-aligned LOCOS twin-well process with two separate well implants. First, a first photo resist layer is formed covering the p-well areas. Then n-type impurities are implant into the n-well areas and the first photo resist layer is removed. Next, a thick masking oxide (LOCOS) is selectively grown over the N-well areas. This masking oxide consumes a significant depth of the silicon surface and causes topography that can interfere with subsequent overlaying layers. The masking oxide (LOCOS) typically has a thickness in the range of between about 2000 and 6000 Å and consumes a depth of the silicon substrate in the range of between about 1000 and 3000 Å. Then, using the masking oxide (LOCOS) as an implant mask, p-impurities are implanted into the substrate to form p-wells. The masking oxide (LOCOS) is removed thereby forming depressions in the substrate surface. A nitride masking layer is deposited and patterned to cover the active areas using a second resist layer. Finally, the field oxide is formed over non-active area and overlaps the n and p-well borders. This process creates rugged topology by forming the LOCOS masking layer and the field oxide regions. The substrate surface is lower in the n-well region where the oxide masking layer (LOCOS) consumed the silicon substrate.

The known methods have several variations. However all these various embodiments have in common the use of distinct masking step for forming the masks for the N and P tubs. Moreover, many of these methods produce rough surface topologies that interfere with the layers and structures that overlie them. The topography differences require large depth of focus in lithography exposure which is very difficult to achieve and costly to manufacture. Other methods use thick photoresist to perform self-aligned twin-tub formation after the isolation process. However, the photoresist thickness control and across wafer uniformity, and shrinkage during implantation may endanger the depth as well as the uniformity of intended dopant profiles.

Workers in the art are aware of the problems of complicated process steps and excess surface topography and have attempted to resolve these problems. For example, U.S. Pat. No. 4,525,920 (Jacobs et al.) teaches a method of twin tub formation where a photo resist layer defines the N-tub region. A thermal oxide layer is used to mask the P-tub region. U.S. Pat. No. 4,707,455 (Tsang et al.) teaches a method of twin tub formation where two photoresist layers are used to mask the N and P-tub regions. Then a field oxide (FOX) region is formed and Boron is implanted through the FOX on the P-tub side. However, this method is not self aligning and requires two masks. U.S. Pat. No. 4,435,895 (Parrillo et al.) teaches a self-aligned tub process where the N tub is defined by a nitride/oxide mask. Then a thick oxide is grown in the unmasked areas, the nitride layer is removed, and the p-well is formed in the area without the thick oxide. Next, fox areas are formed by a conventional LOCOS process. U.S. Pat. No. 4,806,501 (Baldi et al.) teaches an isolation method where the n and p-wells are defined by two photoresist masks. However, these methods can be improved by reducing the number of process steps, reducing the surface topology and eliminating the use of photoresist as implant masks.

SUMMARY OF THE INVENTION

It is an objective of the present invention to provide a method for fabricating twin tub CMOS devices which allows a reduction of the masking and furnace steps required to obtain CMOS devices, reduces the manufacturing time and lowers the production costs.

It is another objective of the present invention to provide a method for fabricating twin tub CMOS devices that is self aligning, reduces surface topography and is easy to manufacture.

Still another objective of the present invention is to provide a method which allows fabrication of CMOS devices of reliable quality and in any case completely comparable to CMOS devices made according to the prior art process.

It is another objective of the present invention to provide a method of fabricating triple or more CMOS wells that is self aligning, reduces surface topography and is easy to manufacture.

It is another objective to fabricate buried layers for bipolar devices added to CMOS process without the need to grow an epitaxy layer.

To accomplish the above objectives, the present invention provides two embodiments of a self-aligning method of manufacturing twin tubs. The embodiments provide a one photo mask, self aligned twin well process that uses a BPSG implant masking layer 16 to provide superior implant profile control. The process also uses two channel stops implants as well as two separate well implants and two Threshold Voltage ($V_{th}$) implants (i.e., PMOS Vth and blanket Vth adjustment implant). The first embodiment uses a barrier layer formed of silicon nitride and the second embodiment uses an amorphous silicon barrier layer.

The first embodiment begins by forming spaced field oxide regions 12 in the substrate. The spaced field oxide regions define first regions (e.g., N-tub regions) and second regions (e.g., P-tub regions). An ion implant masking layer 16 composed of borophosphosilicate glass (BPSG) and a silicon nitride barrier layer 18 are formed over the field oxide regions and the substrate. Using a patterned photoresist layer, the silicon nitride barrier layer and upper portions of the masking layer over the n-tub region are anisotropically etched. The photoresist layer is then removed. Next, the remaining masking layer 16 over the n-tub region is selectively etched. N-type impurities are implanted into the N-tub region forming a n-well using the nitride barrier layer and BPSG masking layers as an implant mask. P-type impurities are then implanted into the substrate. The p-type impurities form a p-type layer beneath the N-well and a P-well in the p-tub region. The silicon nitride layer and the masking layer are removed. The substrate is then annealed to drive in the ion implanted impurities thereby forming a n-well and a p-well. A threshold voltage layer and channel stop layer can also be implanted at the appropriate steps.

The second embodiment of the present invention is similar to the first except that the barrier layer is composed of amorphous silicon and the etch steps involving the amorphous silicon barrier layer use etches appropriate to the amorphous silicon layer.

The embodiments of the invention provide a one photo mask, self aligned twin well process that provide improve implant profile control, that reduce surface topology, and that are easy to manufacture. The use of the BPSG barrier layer as an high energy implant barrier mask has two advantages over conventionally employed photoresist layers used as implant masks. First, the high energy implants do not erode the BPSG masking layer. Therefore, the thickness of the BPSG masking layer is constant during the entire high energy implantation.

Moreover, the process of the invention provides a smooth topology because the substrate is oxidized only once in forming the FOX 12 (No LOCOS mask is needed). The masking layer 16 also does not roughen the substrate topography like the LOCOS approaches do. The process reduces the number of masking steps and is self aligned which reduces the spacing.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides two embodiments of a method of manufacturing self-aligning twin tubs. The first embodiment uses a disposable hard implant mask of BPSG and a thin silicon nitride barrier layer to form a self aligned twin tub mask. The second embodiment uses a thin amorphous silicon barrier layer to form a self aligned twin tub mask.

Figure 1A:
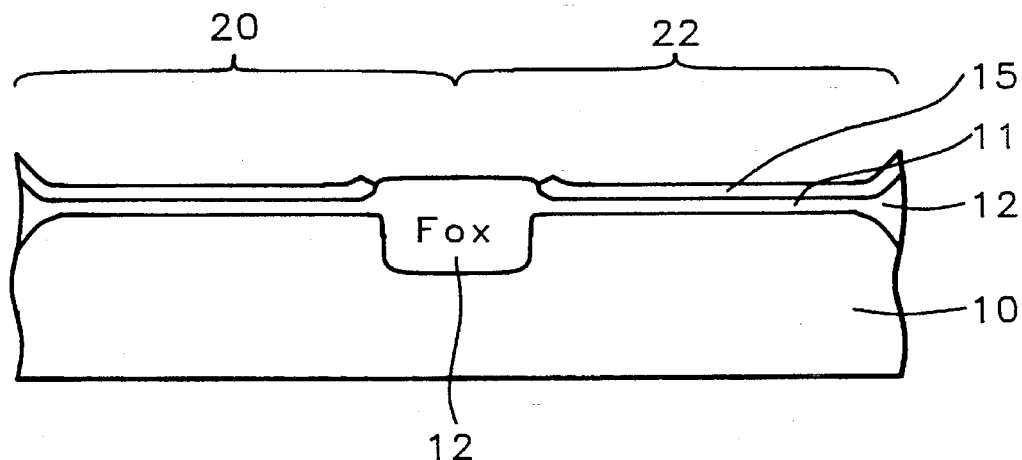
FIGS. 1A-1B, 2-3, 4A-AB and 5 are cross sectional views for illustrating a first embodiment of the method for manufacturing twin tubs according to the present invention.

The present invention of fabricating a self aligned twin well in a semiconductor substrate begins by providing a semiconductor substrate 10 as shown in FIG. 1A. The preferred substrate is composed of a P-type single crystal silicon has a (100) crystallographic orientation. The substrate preferably has a background p-type doping with a concentration in the range of between about 1E14 and 1E15 atoms/cm$^3$.

Next, a relatively thick field oxide (FOX) 12 is formed around active device areas to electrically isolate these areas. The spaced field oxide regions 12 define first type regions (e.g., n-tub regions) 20 where first type wells (e.g., n-wells) will be formed and second type regions (e.g., p-tub regions) 22 where second type wells (e.g., p-wells) will subsequently formed. The type of well (i.e., p or n) formed can be switched. For this illustration the first type will be n-type and the second type will be p-type. One method of forming the field oxide regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. As shown in FIG. 1A, a silicon oxide layer 11 and a nitride oxidation barrier layer 15 are formed on the silicon surface. The nitride layer 15 is patterned and the substrate is oxidized to form the FOX regions 12. The silicon oxide layer 11 and the nitride layer 15 are removed. Semiconductor devices can then be formed in the openings between the isolation regions 12. The field oxide 12 preferably has a thickness in the range of between about 4000 and 7000 Å.

Figure 1B:
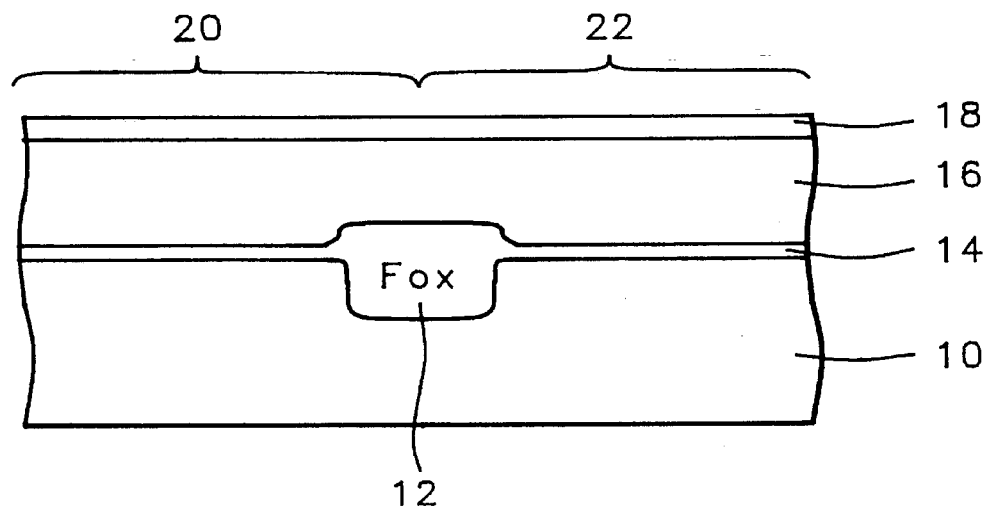

As shown in FIG. 1B, preferably a first oxide layer 14 is grown over the silicon substrate surface. The first oxide layer 14 preferably has a thickness in the range of between about 200 and 400 Å. The oxide layer 14 can be the original oxide layer 11 or be regrown.

A masking layer 16 is formed over the first oxide 14 and the field oxide regions 12. The masking layer 16 is preferably composed of borophosphosilicate glass (BPSG), or phosphosilicate glass (PSG) and is more preferably composed of BPSG. The masking layer 16 preferably has a thickness depending on the n-type well implantation energy. The masking layer 16 is designed to block the n-type ions from implanting into the p-type region. The masking layer's thickness should preferably be the depth range of the implant plus three sigma of the (e.g., n-type) doping profile. The masking layer must be thick enough to block substantially all (e.g., 3 sigma) of the implanted impurities.

As shown in FIG. 1B, a barrier layer 18 is then formed over the masking layer 16. In the first embodiment the barrier layer is preferably composed of silicon nitride. The barrier layer 18 preferably has a thickness in the range of between about 300 and 600 Å. The silicon nitride barrier layer 18 can be formed by a LPCVD process.

In the second embodiment, the barrier layer 18 is composed of amorphous silicon layer. The amorphous polysilicon layer can be deposited using He-diluted $SiH_4$ at a percentage between about 10 and 30% and more preferably about 20%; at a pressure in the range between about 0.5 and 2.0 torr and more preferably about 1 torr; and at a temperature in the range between about 550° to 590° C. and more preferably about 570° C. The amorphous polysilicon layer is preferably deposited using silane at a temperature less than 600° C. The amorphous barrier layer 18 preferably has a thickness in the range of between about 300 and 600 Å and more preferably about 500 Å. As explained in more detail below, the barrier layer 18 functions to protect the masking layer 16 in the p-well region 22 during the second BPSG masking etch of the n-tub region 20 (see FIG. 3).

Figure 2:
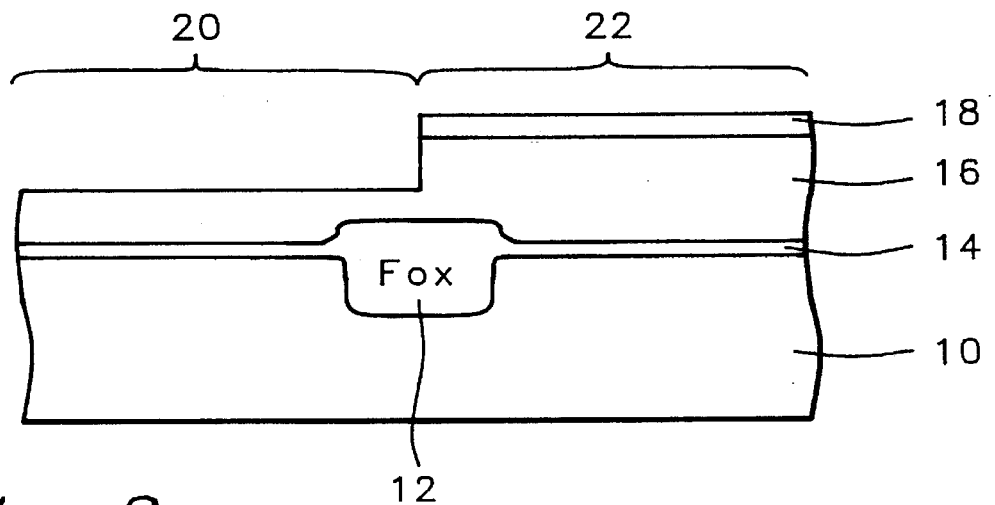

Turning to FIG. 2, using conventional photo-etching techniques, the barrier layer 18 and upper portions of the masking layer 16 the over the n-tub region 20 are anisotropically etched. To accomplish this a photoresist layer is formed with an opening over the N-tub regions. The anisotropic etching removes the barrier layer 18 and a thickness of the upper portion of the masking layer 18 in the range of between about 75% and 85% of the total thickness of the masking layer and more preferably about 80% of the masking layer. The anisotropic etch can be performed with conventional oxide etchants, such as $CHF_3$. The photoresist layer is then removed.

Figure 3:
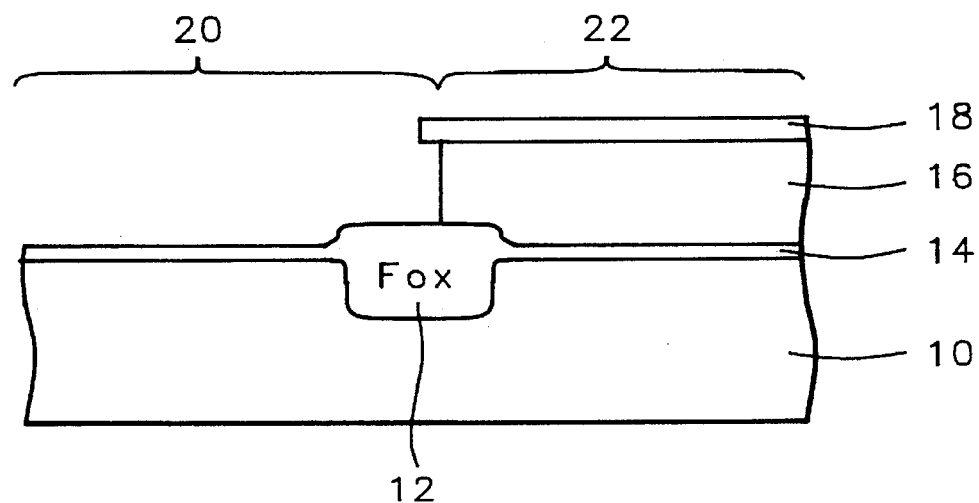

As shown in FIG. 3, the remaining masking layer 16 over the n-tub region 20 is selectively etched with respect to silicon oxide so that the first oxide layer 14 is exposed. The selective etch (with respect to silicon oxide) for an masking layer composed of BPSG is preferably a wet etch, such as an ammonia peroxide wet etch. The wet etch does not damage the substrate surface and cause defect as an anisotropic etch can. This improves yields. The barrier layer 18 protects masking layer 16 over the p-tub region 22 during this second masking layer 16 etch (in the N-tub region 20).

Figure 4A:
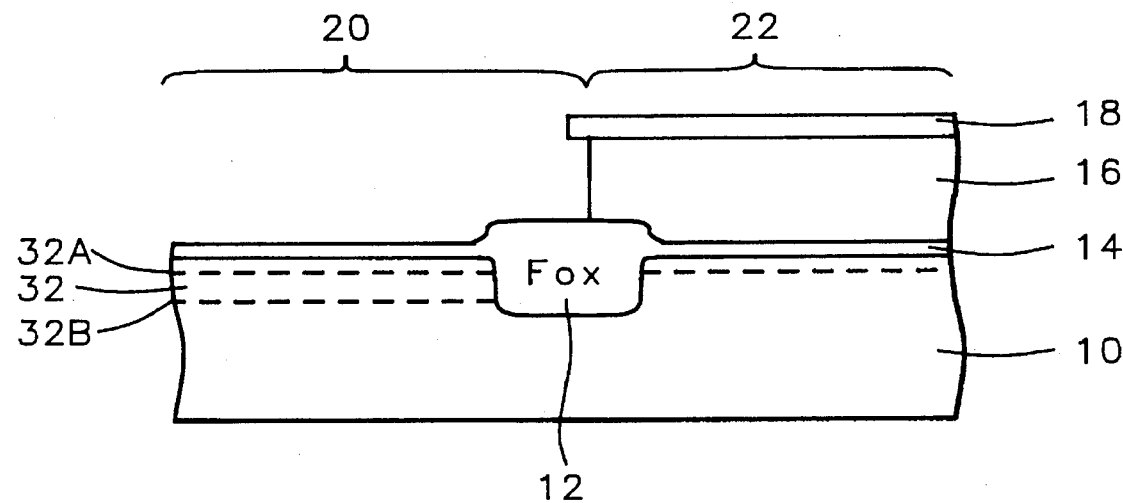

Referring to FIG. 4A, N-type impurities (e.g., first conductivity type impurities) are ion implanted into the N-tub region 20 forming a self aligned n-well 32 using the barrier layer 18 and masking layer 16 as an implant mask. Preferably two implantations are performed. One option is to make a arsenic implant and a phosphorous implant. A second preferred option is to make two (a double) phosphorous implants. The double implants form a high/low doping profile (channel stop 32A and n-well 32B). The low energy implant (e.g., arsenic) impurities 32A will remain closer to the surface of the substrate during the drive in step providing an effective channel stop for p-channel devices and also protecting against punchthrough. After the implant, the accumulation of impurity ions is shown symbolically by the layer 32 in FIG. 4A-4B. The high energy implanted impurities penetrate further into the substrate as shown by the dotted lines 32B. An example of the n-well ion implantation is a double phosphorous implant performed with a doses in the range of between about 1E13 and 1E14 atoms/cm$^2$ and at an energy in the range of between about 450 Kev and 1 MeV.

Figure 4B:
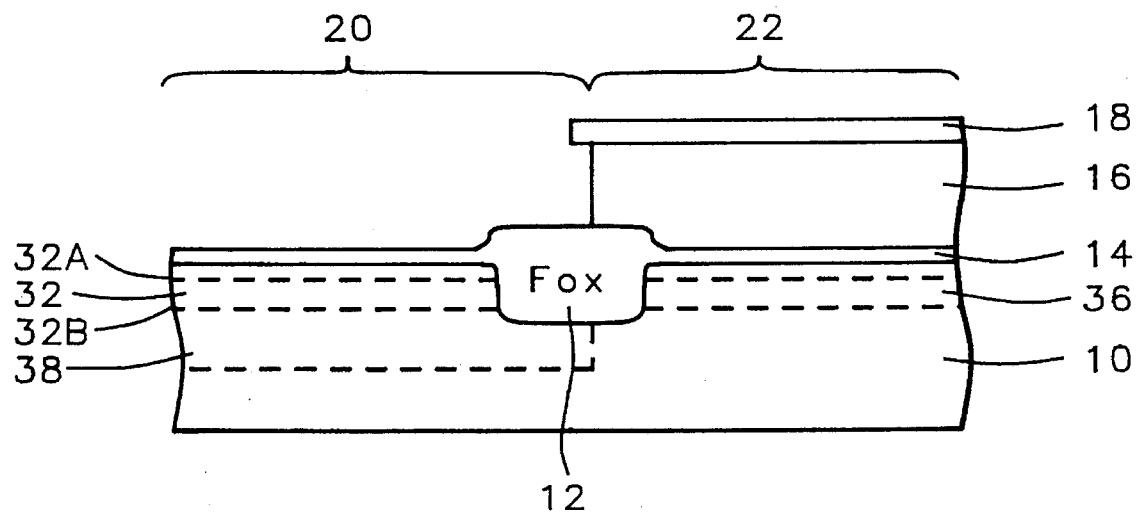

Next, As shown in FIG. 4B, p-type impurities are implanted into the substrate to form the p-well 36 and the p-type layer 38. The p type impurities can penetrate the barrier layer 18 and the masking layer 16 as shown in FIG. 4B. The p-type impurities forming a p-type layer 38 beneath the N-well 32 and a P-well 36 in the p-tub region 22. Preferably two boron ion implants are used to form the p-layer 38 and p-well 36. The p-well ion implantation is preferably performed with boron ions with a dose preferably in the range of between about 1E13 and 1E14 atoms/cm$^2$ and at an energy preferably in the range of between about 1 Mev and 2 Mev.

Figure 5:
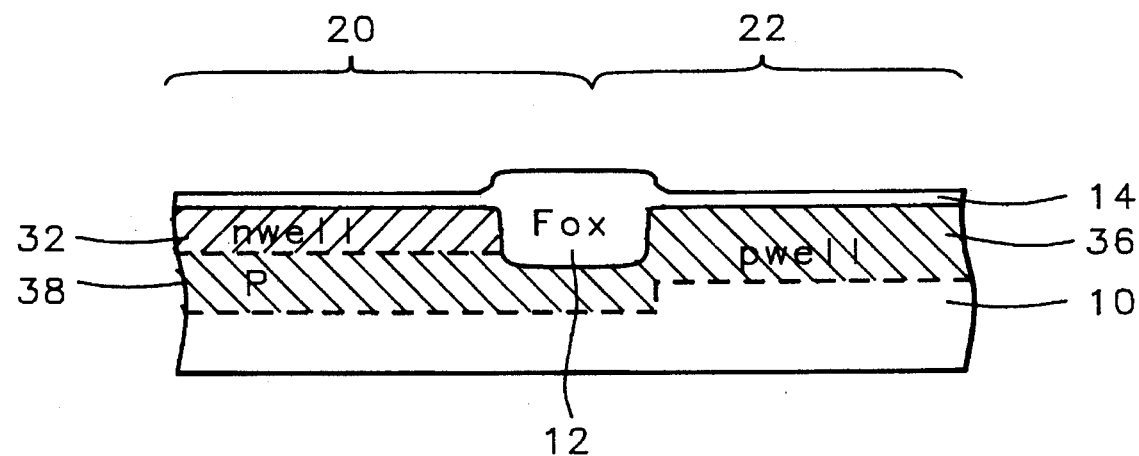

Referring to FIG. 5, the barrier layer 18 and the masking layer 16 are then removed. A barrier layer composed of silicon nitride is preferably removed using a hot phosphoric acid etch. A masking layer 16 composed of BPSG is preferably removed using an etch selective to silicon oxide layer 14, such as an ammonia peroxide wet etch. A barrier layer 18 composed of amorphous silicon can be removed using a down stream plasma etch with $SF_6$.

The substrate is then preferably annealed twice using a rapid thermal anneal (RTA) and a furnace anneal to drive in the implanted impurities thereby forming a n-well 32 and a p-well 36 38. See FIG. 5. The RTA anneal is preferably performed at a temperature in the range of between about 1000 and 1200 C and for a time in the range of between about 1 and 10 minutes. The furnace anneal temperature is preferably in the range between about 900 and 1000° C. for a time in the range between about 120 and 240 minutes.

After the anneal, the n-well 32 preferably has an impurity concentration in the range of between about 1E16 and 1E17 atoms/cm$^3$ and extends to depth below the silicon surface in the range between about 0.8 and 1.2 μm and more preferably about 1 μm. Also, the p-well 36 preferably has an impurity concentration in the range of between about 1E16 and 1E17 and a depth preferably in the range between about 0.8 and 1.2 μm and more preferably about 1 μm. The p-type layer 38 preferably has an impurity concentration in the range of between about 1E16 and 1E17 and a depth preferably in the range between about 1.5 and 2.5 μm and more preferably about 2 μm.

An optional blanket threshold adjustment implant is preferably performed by implanting a p-type impurities into the substrate thereby forming a threshold voltage layer. The blanket threshold adjustment implant is preferably performed with boron impurity ions with an energy in the range of about 30 Kev and a dose in the range of between about 1E12 and 1E13 atoms/cm$^2$.

Figure 6:
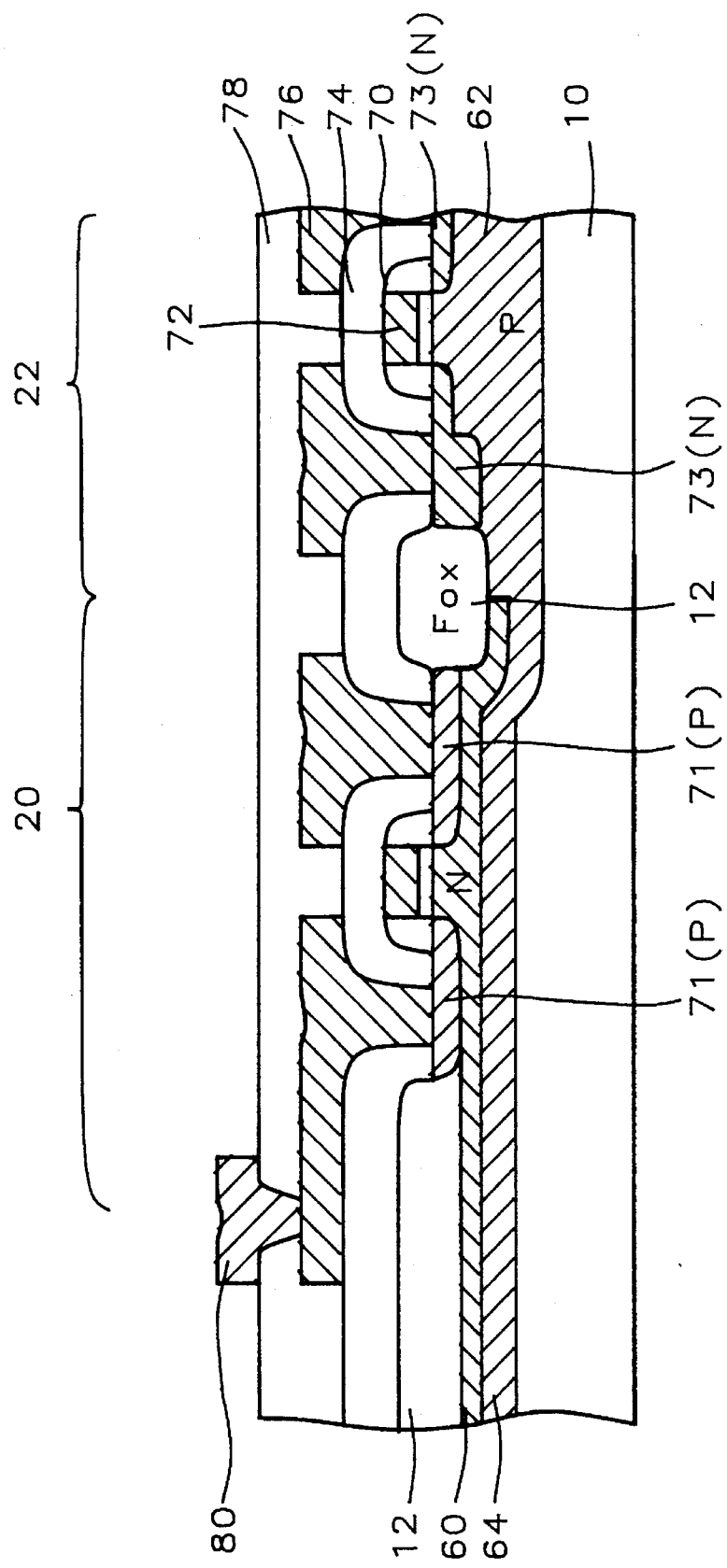
FIG. 6 is a cross sectional view for illustrating CMOS devices formed on the two wells of the first and second embodiments according to the present invention.

After the formation of the P-wells 36 and N-wells 32, semiconductor devices can be formed on the substrate. FIG. 6, illustrates a CMOS device incorporating twin tubs formed by a process according to the first and second embodiments of the present invention. Using conventional semiconductor processing, the gate structures 70 72 are generated on the substrate surface in the p-tub 22 and n-tub regions 20. Typically, a gate oxide layer, a polysilicon layer, and a top masking layer are deposited and patterned to form gates structures 70 72. Sidewall spacers 70 can be added. To create source/drain regions 73 for NMOS transistors, an ion implantation is executed in the n-tub region 22 after masking the p-tub region 20 with photoresist. The implantation preferably uses one of the elements selected from the group consisting of arsenic and antimony. The photo resist is then removed. Then, a photoresist masking layer is formed covering the n-tub region 22. The source/drain regions 71 of the PMOS transistors are formed by a boron implantation. The photoresist masking layer is then removed. An insulating layer 74 with a contact hole therein, is formed over the gate structures and substrate surface. Next, a metal interconnect level 76 is formed thereafter. Subsequent insulation layers (e.g., 78) and metal layers 80 are formed to electrically connect the semiconductor devices to form a circuit.

It should be noted that the implantation order of the ions to obtain the N and P tubs can be reversed. It should be noted that the thickness indicated are indicative and their values are determined only by the need to screen particular etchings or to allow implanting through them. Using similar techniques, it is within the scope of the invention of providing p-doped tubs instead of n-doped tubs by appropriate conductivity type changes in the previously described method steps.

The two embodiments of the present invention provide a one photo mask, self aligned twin well process that provides improve implant profile control, reduces surface topology, and is easy to manufacture. The use of the BPSG barrier layer 16 as an high energy implant barrier mask has two advantages over conventionally employed photoresist layers used as implant masks. First, the high energy implants do not erode the BPSG masking layer. Therefore, the thickness of the BPSG masking layer is constant during the entire high energy implantation. In contrast, the high energy implantation often erodes the photoresist so that the photoresist is does not have a constant thickness during the implantation. This thickness variation allows the implant profile control to deviate from the set target thereby producing variations in implant profiles. The BPSG layer of the present invention solves this implant control problem because the BPSG masking layer is implant resilient and does not erode during high energy implantation.

The two step etch of the barrier layer and the masking layer using an anisotropic etch followed by a wet etch prevents the anisotropic etch from damaging the substrate surface. This increases device yields.

Moreover, the process of the invention provides a smooth topology because the substrate is oxidized only once in forming the FOX 12 (No LOCOS mask is needed). The masking layer 16 also does not roughen the substrate topography like the LOCOS approaches do. The smooth topology increases the yields of the overlying layers and therefore increases the overall device yields. The process reduces the number of masking steps and is self aligned which reduces the spacing.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a self aligned twin well in a semiconductor substrate, said twin well comprising a first type well and second type well, comprising the steps of:
   a) forming spaced field oxide regions in said substrate, said spaced field oxide regions defining a first region and a second region;
   b) forming a first oxide layer over a substrate surface including said first and second regions;
   c) forming a BPSG masking layer and then a barrier Layer over said field oxide regions and said first oxide layer;
   d) removing a portion of said barrier layer and a portion of said masking layer over said first region exposing said first oxide layer by anisotropically etching said barrier layer and an upper portion of said masking layer over said first region, and selectively wet etching a lower portion of a remaining masking layer over said first region exposing said first oxide layer;
   e) first implanting first conductivity type impurities into said first region forming a first type well using remaining portions of said barrier layer and said masking layer over said second region as a mask;
   f) second implanting second type conductivity impurities through said mask into said substrate, said second conductivity type impurities forming a second conductivity type layer beneath said first type well and forming a second type well in said second region;
   g) removing said barrier layer, said masking layer, and said first oxide layer after said second implanting; and
   h) annealing said substrate to drive in the implanted said first conductivity and second conductivity type impurities thereby completing said first type well and said second type well.

2. The method of claim 1 which further includes performing a blanket threshold adjustment implant comprising implanting a second conductivity type impurity into said substrate thereby forming a threshold voltage layer; wherein the blanket threshold adjustment implant is performed with arsenic impurity ions with an energy in a range of between about 25 and 35 Kev and a dose in a range of between about 1E12 and 1E13 atoms/cm$^2$.

3. The method of claim 1 wherein step (d) the removing of said barrier layer and said masking layer over said first regions is performed by anisotropically etching said barrier layer and upper portions of said masking layer said over said first region; and selectively etching the remaining masking layer over said first region exposing said first oxide layer.

4. The method of claim 1 wherein said barrier layer is composed of a material selected from the group consisting of silicon nitride and amorphous silicon and said masking layer is composed of borophosphosilicate glass (BPSG).

5. The method of claim 1 wherein said field oxide regions have a thickness in a range of between about 4000 and 7000 Å.

6. The method of claim 1 wherein said barrier layer has a thickness in a range of between about 300 and 600 Å.

7. The method of claim 1 wherein the anisotropic etching in step (d) removes a thickness of said upper portion of said masking layer in a range of between about 70 and 90 percent of a total thickness of said masking layer.

8. The method of claim 1 wherein the implantation in step (e) is performed with two separate phosphorus ion implants comprising a first lower energy implant and a second higher energy implant; wherein the first lower energy implant and the second higher energy implant having an dose in a range of between about 1E13 and 1E14 atoms/cm$^2$ and at an energy in a range of between about 450 Kev and 1 Mev.

9. The method of claim 1 wherein the implantation in step (f) is performed with a two step boron implant having a dose in a range of between about 1E13 and 1E14 atoms/cm$^2$ and at an energy in a range of between about 1 and 2 MeV.

10. The method of claim 1 wherein the annealing in step (h) is performed using a rapid thermal anneal process and a furnace anneal; said rapid thermal anneal process performed at a temperature in a range of between about 1000° and 1200° C. and for a time in a range of between about 1 and 10 minutes; and said furnace anneal is performed at a temperature in a range of between about 900° and 1000° C. and for a time in a range of between about 120 and 240 minutes.

11. The method of claim 1 wherein after step (h), said first type well has an n-type impurity concentration in a range of between about 1E16 and 1E17 atoms/cm$^3$ and extends downward below the substrate surface a depth in a range of between about 0.8 and 1 μm and said second type well has an p-type impurity concentration in a range of between about 1E13 and 1E14 atoms/cm$^3$ and a depth from the substrate surface in a range of between about 0.8 and 1 μm; and said second conductivity type layer beneath said first type well has an p-type impurity concentration in a range of between about 1E16 and 1E17 atoms/cm$^3$ and a depth in a range of between about 1.8 and 2.2 μm.

12. The method of claim 1 which further includes
   a) forming a gate oxide layer over the substrate surface;
   b) depositing and patterning a polysilicon layer to form gate structures on said substrate in said second and first regions;
   c) executing an ion implantation in the first region after masking the second region with photoresist to create source/drain regions for NMOS transistors, said implantation utilizing one of the elements selected from the group consisting of arsenic and antimony; and then removing said photoresist;

d) forming a photoresist masking layer over the first region;

e) executing a boron implantation for generating the source/drain regions for PMOS transistors;

f) removing the photoresist masking layer after said boron implantation and g) depositing an insulating layer, etching a contact hole therein, and forming a metal interconnect level thereafter.

13. The method of claim 1 wherein said first type well is a N conductivity type well and said second type well is a p conductivity type well.

14. A method of fabricating a self aligned twin well in a semiconductor substrate, comprising the steps of:

a) forming spaced field oxide regions in said substrate, said spaced field oxide regions defining a first region and a second region;

b) forming a first oxide layer over a substrate surface including said first and second regions;

c) forming a masking layer composed of borophosphosilicate glass (BPSG) and then a barrier layer over said field oxide regions and said first oxide layer, said barrier layer composed of a material selected from the group consisting of silicon nitride and amorphous silicon;

d) anisotropically etching a portion of said barrier layer and an upper portion of said masking layer over said first region;

e) selectively wet etching a lower portion of a remaining masking layer over said first region exposing said first oxide layer;

f) first implanting N-type impurities into said first region forming a N-well using remaining portions of said barrier layer and said masking layer over said second region as a mask;

g) second implanting P-type impurities through said mask into said substrate, said P-type impurities forming a p-type layer beneath said N-well and forming a P-well in said second region;

h) removing said barrier layer after said second implanting;

i) removing said masking layer and said first oxide layer after removing said barrier layer; and j) annealing said substrate to drive in the implanted said first and second type impurities thereby forming a N-well and a P-well.

15. The method of claim 14 which further includes performing a blanket threshold adjustment implant comprising implanting a p-type impurity into said substrate and said well regions thereby forming a threshold voltage layer; the blanket threshold adjustment implant is performed with arsenic impurity ions with an energy in a range of between about 25 and 35 Kev and a dose in a range of between about 1E12 and 1E13 atoms/cm$^2$.

16. The method of claim 14 wherein said field oxide regions have a thickness in a range of between about 4000 and 7000 Å.

17. The method of claim 14 wherein said barrier layer has a thickness in a range of between about 300 and 600 Å.

18. The method of claim 14 wherein the anisotropic etching in step (d) removes a thickness of said upper portion of said masking layer in a range of between about 70 and 90 percent of a total thickness of said masking layer.

19. The method of claim 14 wherein the implantation in step (f) is performed with two separate phosphorus ion implants comprising a first lower energy implant and a second higher energy implant, said first lower energy implant and said second higher energy implant having an dose in a range of between about 1E13 and 1E14 atoms/cm$^2$ and at an energy in a range of between about 450 Kev and 1 Mev.

20. The method of claim 14 wherein the implantation in step (g) is performed with a two step implant having a dose in a range of between about 1E13 and 1E14 atoms/cm$^2$ and at an energy in a range of between about 1 and 2 MeV.

21. The method of claim 14 wherein the annealing in step (j) is performed using a rapid thermal anneal process and a subsequent furnace anneal, said rapid thermal anneal process performed at a temperature in a range of between about 1000° and 1200° C. and for a time in a range of between about 1 and 10 minutes; and said furnace anneal is performed at a temperature in a range of between about 900° and 1000° C. and for a time in a range of between about 120 and 240 minutes.

22. The method of claim 14 wherein after step (j), said N-well has an impurity concentration in a range of between about 1E16 and 1E17 atoms/cm$^3$ and extends downward below the substrate surface a depth in a range of between about 0.8 and 1 μm and said P-well has an impurity concentration in a range of between about 1E13 and 1E14 atoms/cm$^3$ and a depth from the substrate surface in a range of between about 0.8 and 1 μm; and said p-type layer beneath said N-well has an impurity concentration in a range of between about 1E16 and 1E17 atoms/cm$^3$ and a depth from the substrate surface in a range of between about 1.8 and 2.2 μm.

23. The method of claim 14 which further includes a) forming a gate oxide layer over the substrate surface;

b) depositing and patterning a polysilicon layer to form gate structures on said substrate in said second and first regions;

c) executing an ion implantation in the first region after masking the second region with photoresist to create source/drain regions for NMOS transistors, said implantation utilizing one of the elements selected from the group consisting of arsenic and antimony; and then removing said photoresist;

d) forming a photoresist masking layer over the first region;

e) executing a boron implantation for generating the source/drain regions for PMOS transistors;

f) removing the photoresist masking layer after said boron implantation; and g) depositing an insulating layer, etching a contact hole therein, and forming a metal interconnect level thereafter.

* * * * *